United States Patent [19]
Imai et al.

[11] Patent Number: 4,630,922
[45] Date of Patent: Dec. 23, 1986

[54] PATTERN TRANSFER APPARATUS

[75] Inventors: Shunzo Imai, Yamato; Ichiro Ishiyama, Kawasaki, both of Japan

[73] Assignee: Canon Kabushiki Kaisha, Tokyo, Japan

[21] Appl. No.: 707,235

[22] Filed: Mar. 1, 1985

[30] Foreign Application Priority Data

Mar. 6, 1984 [JP]   Japan .................................. 59-41326

[51] Int. Cl.[4] .............................................. G03B 27/52
[52] U.S. Cl. ...................................... 355/55; 250/548; 356/401
[58] Field of Search ............................. 355/55, 56, 43; 250/548; 356/401

[56] References Cited

U.S. PATENT DOCUMENTS 4,275,306   6/1981   Kato et al. ........................... 250/548
4,506,977   3/1985   Sato et al. ........................... 355/55 X

*Primary Examiner*—Richard A. Wintercorn
*Attorney, Agent, or Firm*—Fitzpatrick, Cella, Harper & Scinto

[57] ABSTRACT

An apparatus for irradiating a first object so as to achieve at least one of alignment between the first object and a second object and transfer of a pattern of the first object onto the second object. The apparatus includes an optical device disposed in the path of the irradiating beam to correct or prevent any change in the optical path length depending on the thickness of the first object.

23 Claims, 3 Drawing Figures

PATTERN TRANSFER APPARATUS

BACKGROUND OF THE INVENTION

This invention relates to an apparatus for transferring a pattern of a first object onto a second object and, more particularly, to an apparatus for transferring a semiconductor circuit pattern of a reticle or mask onto a wafer, during processes for manufacturing semiconductor circuit devices such as integrated circuits (ICs), large scaled integrated circuits (LSIs), very large scaled integrated circuits (VLSIs), etc.

A known type of pattern transfer apparatus for use in the manufacture of semiconductor devices is illustrated in FIG. 1. In this pattern transfer apparatus, an illumination unit 1 for illuminating a pattern formed on a pattern bearing surface 4a of a reticle 4 carried by a reticle stage 5, is disposed above the reticle 4, and an alignment unit 2 for achieving alignment between the reticle 4 and a wafer 7 carried by a wafer stage 8 is disposed between the reticle 4 and the illumination unit 1. A projection lens 6 is employed to project the pattern of the reticle 4 onto the wafer 7. The illumination unit 1 includes a masking member 1a located at a position optically conjugate with the pattern bearing surface 4a of the reticle 4. The masking member 1a is effective to block the light so that an area on the reticle 4 which should not be exposed is shielded against the light. The masking member 1a has a light-transmitting window whose area can be variably set relative to the pattern bearing surface 4a of the reticle 4.

The alignment unit 2 comprises an optical system and a predetermined relation should be maintained between this optical system and the pattern bearing surface 4a of the reticle 4. For example, in a case where the alignment unit 2 is arranged to detect any positional deviation between the reticle 4 and wafer 7 by scanning alignment marks formed on the reticle 4 and wafer 7 with a laser beam emitted from the alignment unit 2 and where the alignment between the reticle 4 and wafer 7 is achieved on the basis of the result of detection, the laser beam emerging from the alignment unit 2 has to be focused on the pattern bearing surface 4a of the reticle 4.

If, on the other hand, the thickness of the reticle carried by the reticle stage 5 is changed, the optical path length from the illumination unit 1 or the alignment unit 2 to the pattern bearing surface 4a of the reticle 4 changes accordingly. As the result, the conjugate relation between the masking member 1a and the pattern bearing surface 4a of the reticle 4 can not be maintained. Further, the laser beam emerging from the alignment unit 2 would not be focused on the pattern bearing surface 4a. Such changes in the optical path length must be compensated for.

It is now assumed that the reticle 4 is replaced by another reticle 4b having a thickness T which is greater than the thickness $t_1$ of the reticle 4 by an amount $t_2$. In such case, the illumination unit 1, alignment unit 2 and a mirror 3 have to be moved upwardly by an amount suitable for correcting the optical path length through an amount corresponding to the increment $t_2$ in the thickness of the reticle. The amount of movement d can be given by the following equation:

$$d = t_2(1 - 1/n) \quad (1)$$

wherein n is the refractive index of each of the reticles 4 and 4b.

An ordinary reticle has a thickness $t_1 = 2.3$ mm. It is now assumed that the reticle 4b substituted for the reticle 4 has a thickness T $(=t_1+t_2)=6$ mm $(=2.3$ mm$+3.7$ mm) and a refractive index n$=1.516$. From equation (1), it follows that the amount of movement d of each of the illumination unit 1, alignment unit 2 and mirror 3 is approx. 1.26 mm.

Each of the illumination unit 1 and the alignment unit 2 must be disposed in a determined relation, with respect to the distance, with the pattern bearing surface of the reticle in order to maintain a predetermined positional relation such as focusing or conjugate relation. For this reason, practically the illumination unit 1 and the alignment unit 2 are positioned, during assembly of the pattern transfer apparatus, relative to the reticle stage 5 while taking into account the thickness of the reticle which thickness is usually $t_1$ $(=2.3$ mm).

However, there exist commercially available reticles, although not so many, having thicknesses different from the thickness $t_1$, e.g. the aforementioned T $(=6$ mm). If use of such reticles is desired, the illumination unit 1 and the alignment unit 2 have to be adjusted again relative to the reticle stage 5. Actually, however, such adjustment after the transfer apparatus has been assembled is not practicable because it requires extraordinarily difficult and complicated operations to accurately move the illumination unit 1 and the alignment unit 2 through a substantial distance such as 1.26 mm where the thickness is T $(=6$ mm).

SUMMARY OF THE INVENTION

It is accordingly a primary object of the present invention to provide a pattern transfer apparatus capable of accurately transferring a pattern of a first member onto a second member independently from the thickness of the first member.

It is another object of the present invention to provide a pattern tranfer apparatus wherein correction for achieving accurate pattern transfer according to any changes in the thickness of a member having a pattern to be tranferred can be made easily.

It is a further object of the present invention to provide a pattern transfer apparatus suitably usable in the processes for manufacturing semiconductor circuit devices.

Briefly, according to the present invention, there is provided an apparatus for irradiating a first object so as to achieve at least one of alignment between the first object and a second object and for transfer of a pattern of the first object onto the second object. The apparatus includes an optical device disposed in the path of the irradiating beam to correct or prevent any change in the optical path length depending on the thickness of the first object.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
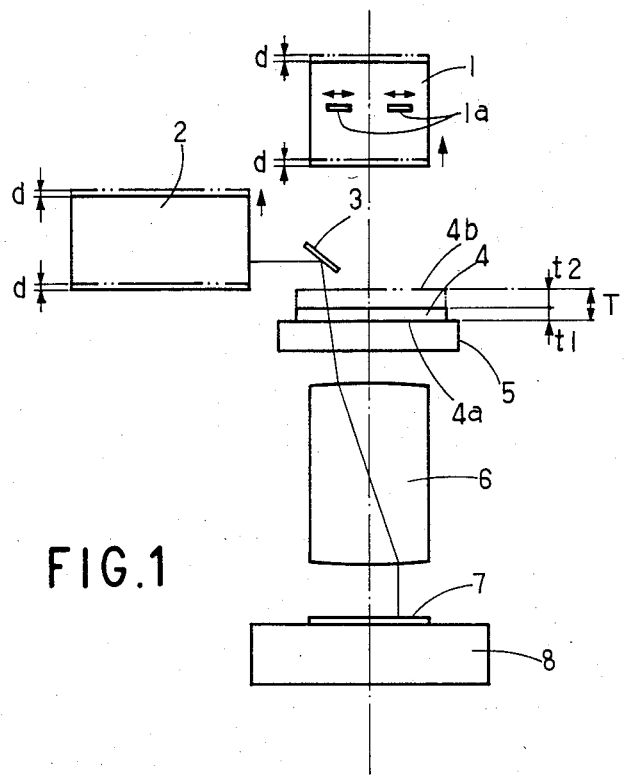
FIG. 1 is a schematic view for illustrating inconveniences peculiar to a known type pattern transfer apparatus.
Figures 2, 3:
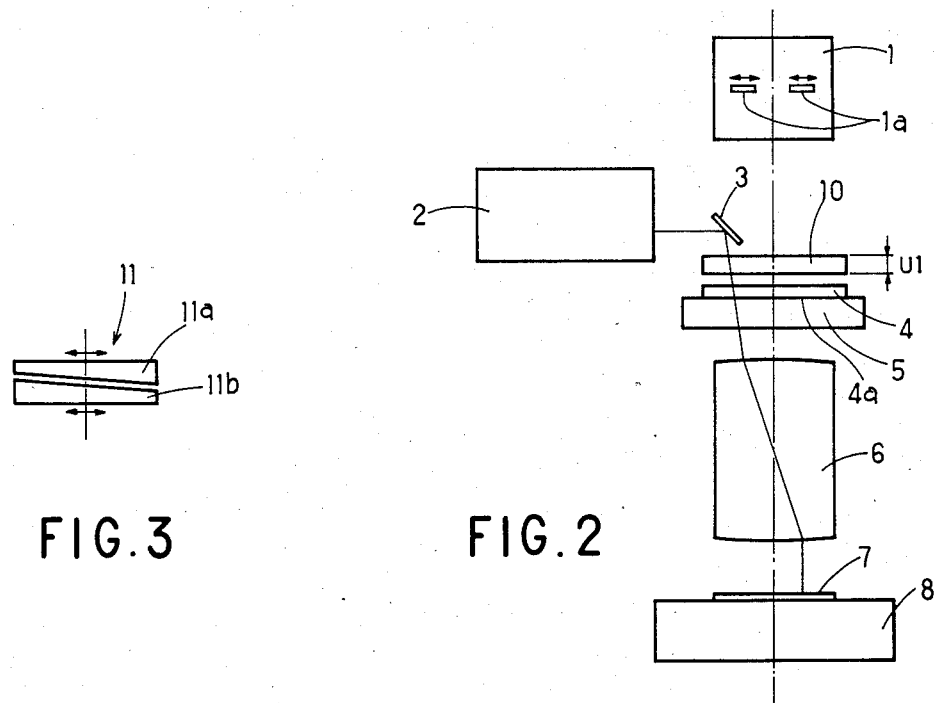
FIG. 2 is a schematic view showing a pattern transfer apparatus according to an embodiment of the present invention.
FIG. 3 is a schematic view showing a modified form of one of the major portions of a pattern transfer apparatus, according to another embodiment of the present invention.

Referring to FIG. 2, a pattern transfer apparatus according to a first embodiment of the present invention includes an illumination unit 1 for supplying an illumination light to transfer a pattern formed on a pattern bearing surface 4a of a reticle 4 onto a wafer 7. A masking member 1a disposed within the illumination unit 1 and is located at a position optically conjugate with the pattern surface 4a of the reticle 4. The masking member 1a has the same function as the masking member 1a of the FIG. 1 apparatus. The pattern transfer apparatus further includes an alignment unit 2 for achieving alignment of unshown alignment marks formed on the pattern surface 4a of the reticle 4 with unshown alignment marks formed on the wafer 7, a retractably disposed mirror 3 for bending the optical path, a reticle stage 5 for carrying thereon the reticle 4, a reduction projection lens 6 for projecting the pattern of the reticle 4 onto the wafer 7, and a wafer stage 8 for carrying thereon the wafer 7. All of these elements are of known type. Particularly, the alignment unit 2 is of a type in which the alignment marks on the reticle 4 and wafer 7 are scanned with a laser beam emitted by a laser source whereby an output for achieving the alignment between the reticle 4 and wafer 7 is produced on the basis of the result of laser beam scanning, such as disclosed in U.S. Pat. No. 4,275,306 and Japanese Patent Application Laid-Open No. 58-25638, etc. Of course, the laser beam scanning may be replaced by electric scanning relative to the reticle 4 and wafer 7 by means of a line sensor array or the like.

In accordance with the present invention, the pattern transfer apparatus of the present embodiment further includes an optical member 10 such as a glass plate made of $SiO_2$, BK7 (optical glass), etc. The optical member 10 is removably disposed between the illumination unit 1 and the pattern bearing surface 4a of the reticle 4 and below the mirror 3 as viewed in FIG. 2. The optical member 10 has an area sufficient to cover the reticle 4 from above and has a particular thickness which is determined in the manner as will be described later. The upper and lower surfaces of the optical member 10 are parallel to the pattern surface 4a of the reticle 4. It is to be noted that the optical member 10 as illustrated in FIG. 2 is only one example and various optical members, such as 10, having different thicknesses corresponding to the thicknesses of reticles can be preparatively manufactured.

Where the optical member 10 is made of quartz as is the reticle 4, both the optical member 10 and reticle 4 have the same refractive index. This is convenient for ease in adjustment which will be described later.

The determination of the thickness of the optical member 10 will now be described.

It is now assumed that an appropriate optical path length is established between the illumination unit 1 and the pattern surface 4a of the reticle 4, for a thickness $t_1$ of the reticle 4 having a refractive index n and for a thickness $u_1$ of the optical member 10 having a refractive index n'. In such case, the relation between $t_1$ and $u_1$ can be expressed as follows:

$$(t_1/n)+(u_1/n')=C \qquad (2)$$

wherein C is a constant. If the reticle 4 and optical member 10 have the same refractive index, i.e. n=n', then equation (2) can be rewritten as follows:

$$t_1+u_1=C_0 \qquad (3)$$

For the sake of simplicity of explanation, the following description will be made for a case where n=n'.

It is now assumed that equation (3) is satisfied and that the thickness of the reticle is changed from $t_1$ to $t_3$. In such case, according to the present embodiment of the invention, the resultant change in the optical path length can be compensated for only by introducing, in place of the optical member 10 of the thickness $u_1$, an optical member 10 having a thickness $u_2$ which satisfies the following equations.

$$t_3+u_2=C_0 \qquad (4)$$

$$u_2=C_0-t_3 \qquad (5)$$

It will be seen from the above that the thickness $u_2$ of the optical member 10 corresponding to the thickness $t_3$ of a different reticle which replaced the reticle 4 can be easily determined only by substituting the thickness $t_3$ into the above equation (5). Similar determination of the thickness is repeated relative to each of the separate reticles having different thicknesses, and optical members such as 10 having different thicknesses are prepared.

By interchanging the optical members 10 having thus determined thicknesses, in accordance with the thickness of the reticle 4 used, the optical path length between the illumination unit 1 and the pattern surface 4a of the reticle can be maintained constant. It will be noted that upwardly moving the illumination unit 1 and alignment unit 2 when the thickness of the reticle is changed (FIG. 1 arrangement) is equivalent to interchanging the optical members 10 (FIG. 2 arrangement). Apparently, the latter is advantageous in the point of ease of operation, cost, etc.

As described in the foregoing, the optical member 10 is located close to the reticle pattern surface 4a and is disposed so as to cover the entire surface of the reticle 4. As a result, the optical member 10 effectively receives any dust or foreign particles falling thereon from the mirror 3 or the like, such that the optical member 10 in fact has a dust-shielding function.

A pattern transfer apparatus according to another embodiment of the present invention will now be described with reference to FIG. 3. The arrangement of the pattern tranfer apparatus according to the present embodiment is essentially the same as that of the FIG. 2 embodiment except that the optical member 10 of FIG. 2 embodiment, which is formed by a single element is replaced, in the FIG. 3 embodiment, by a modified form of optical member comprising a pair of wedge-shaped elements. For this reason, only such modified form of optical member is illustrated in FIG. 3.

As described, the pattern transfer apparatus according to the present embodiment includes an optical member 11 comprising a pair of wedge-shaped optical elements 11a and 11b. Stated generally, the optical member 11 has such a shape that is defined by cutting a flat glass plate, having upper and lower parallel surfaces, along a plane which is inclined relative to the upper and lower surfaces of the glass plate. Thus, the optical elements 11a and 11b are shaped so that the light beam entering into the optical element 11a and the light beam emerging from the optical element 11b are in a parallel relation with each other.

One of the distinctive features of the optical member 11 according to the present embodiment lies in that a desired thickness of the optical member 11 can be easily established only by displacing horizontally at least one of the optical elements 11a and 11b, such as illustrated in FIG. 3. Further, although the FIG. 2 embodiment requires interchanging the optical members 10 having different thicknesses, the replacement is not necessary in the present embodiment because the relative displacement between the optical elements 11a and 11b provides substantially the same effects as provided by interchanging the optical members having different thicknesses.

With reference to the FIG. 2 embodiment, the invention has been described in relation to interchanging optical members having different thicknesses. However, it will be understood that, by interchanging optical members having different refractive indices, the optical path length can be maintained substantially constant so that similar advantageous effects are attainable.

In accordance with the present invention, as has hitherto been described, the pattern transfer apparatus is provided with interchangeable or displaceable optical means having, relative to a particular thickness of the reticle, a predetermined thickness and a predetermined refractive index, which optical means is disposed between an illumination system and the reticle. By this, any changes in the thickness of the reticle can be easily met without moving the illumination systen and the like. Further, the optical means is disposed so as to cover the upper surface of the reticle. With this arrangement, the optical means advantageously has a dust-shielding function as well as the above-described function.

While the invention has been described with reference to the structures disclosed herein, it is not confined to the details set forth and this application is intended to cover such modifications or changes as may come within the purposes of the improvements or the scope of the following claims.

What is claimed is:

1. An apparatus for transferring a pattern of a first object onto a second object, comprising:
    optical means for relating the first and second objects to each other with a beam; and
    correcting means for optically correcting any change in the optical path length between said optical means and the pattern of the first object due to any change in the thickness of the first object, said correcting means including a flat plate-like member.

2. An apparatus according to claim 1, wherein said correcting means is disposed in the optical path between said optical means and the pattern of the first object.

3. An apparatus according to claim 2, wherein said correcting means is removably disposed in the optical path between said optical means and the pattern of the first object.

4. An apparatus according to claim 1; wherein said correcting means corrects the optical path length, through the thickness of said flat plate-like member.

5. An apparatus according to claim 1, wherein said correcting means corrects the optical path length, through the refractive index of said flat plate-like member.

6. An apparatus according to claim 2, wherein said correcting means has an adjustable thickness in the direction in which said beam is transmitted.

7. An apparatus according to claim 6, wherein said correcting means includes a pair of wedge-shaped optical elements.

8. An apparatus according to claim 1, wherein said correcting means maintains a constant optical path length between said optical means and the pattern of the first object irrespective of any change in the thickness of the first object.

9. an apparatus for transferring a pattern of a first object onto a second object, comprising:
    optical means for relating the first and second objects to each other with a beam; and
    correcting means for optically correcting any change in the optical path length between said optical means and the pattern of the first object due to any change in the thickness of the first object, said correcting means being disposed in the optical path between said optical means and the pattern of the first object, and having adjustable thickness in the direction in which the beam is transmitted.

10. An apparatus according to claim 9, wherein said correcting means is removably disposed in the optical path between said optical means and the pattern of the first object.

11. An apparatus according to claim 10, wherein said correcting means includes a flat plate-like member.

12. An apparatus according to claim 10, wherein said correcting means corrects the optical path length, through the thickness of said flat plate-like member.

13. An apparatus according to claim 11, wherein said correcting means corrects the optical path length, through the refractive index of said flat plate-like member.

14. An apparatus according to claim 9, wherein said correcting means includes a pair of wedge-shaped optical elements.

15. An apparatus according to claim 14, wherein said correcting means maintains a constant optical path length between said optical means and the pattern of the first object irrespective of any change in the thickness of the first object.

16. An apparatus for transferring a pattern of a first object onto a second object, comprising:
    optical means for relating the first and second objects to each other with a beam; and
    correcting means for optically correcting any change in the optical path length between said optical means and the pattern of the first object due to any change in the thickness of the first object, said correcting means maintaining a constant optical path length between said optical means and the pattern of the first object irrespective of any change in the thickness of the first object.

17. An apparatus according to claim 16, wherein said correcting means is disposed in the optical path between said optical means and the pattern of the first object.

18. An apparatus according to claim 17, wherein said correcting means is removably disposed in the optical path between said optical means and the pattern of the first object.

19. An apparatus according to claim 18, wherein said correcting means includes a flat plate-like member.

20. An apparatus according to claim 19, wherein said correcting means corrects the optical path length, through the thickness of said flat plate-like member.

21. An apparatus according to claim 19, wherein said correcting means corrects the optical path length, through the refractive index of said flat plate-like member.

22. An apparatus according to claim 17, wherein said correcting means has an adjustible thickness in the direction in which said beam is transmitted.

23. An apparatus according to claim 22, wherein said correcting means includes a pair of wedge-shaped optical elements.

* * * * *